US005220297A

United States Patent [19]

Crowhurst

[11] Patent Number: 5,220,297

[45] Date of Patent: Jun. 15, 1993

[54] TRANSMISSION LINE TRANSFORMER DEVICE

[75] Inventor: David B. Crowhurst, Lindsay, Canada

[73] Assignee: J.E. Thomas Specialties Limited, Ontario, Canada

[21] Appl. No.: 822,694

[22] Filed: Jan. 21, 1992

[30] Foreign Application Priority Data

Mar. 22, 1991 [CA] Canada ................................ 2038873

[51] Int. Cl.$^5$ ................................ H03H 7/38

[52] U.S. Cl. ................................ 333/32; 29/602.1; 333/131; 336/175

[58] Field of Search ................................ 333/119, 131, 25, 32, 333/33; 336/175, 177, 182, 186; 29/602.1, 606

[56] References Cited

U.S. PATENT DOCUMENTS 3,500,252 3/1970 Wakker ................................ 333/131

3,783,415 1/1974 Koskinen ................................ 333/32 X 4,295,107 10/1981 Perlow ................................ 333/32 X

*Primary Examiner*—Paul Gensler

[57] ABSTRACT

A transmission line transformer device has a body of magnetically permeable material defining two passages each of which is adapted to receive a pair of conductors which extend up one passage, between the passages and down the other passage. The conductor insulation and spacing are adapted to provide a predetermined characteristic impedance across the bandwidth and the body dimensions and passage spacing are adapted to provide isolation between the conductors and selected impedance across the bandwidth.

11 Claims, 4 Drawing Sheets

FIG. 7
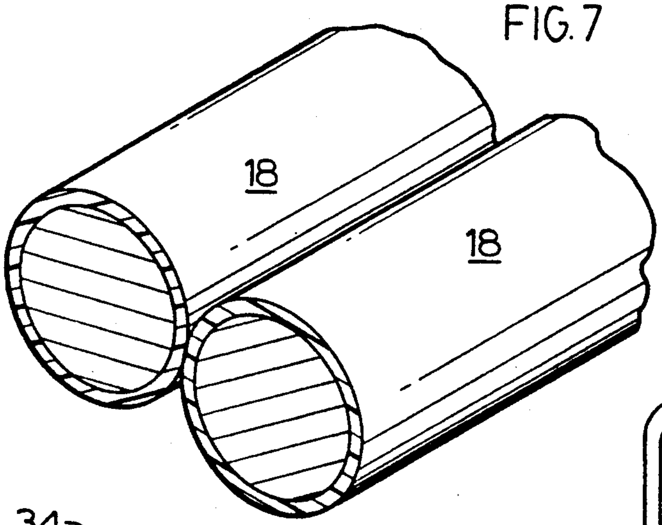
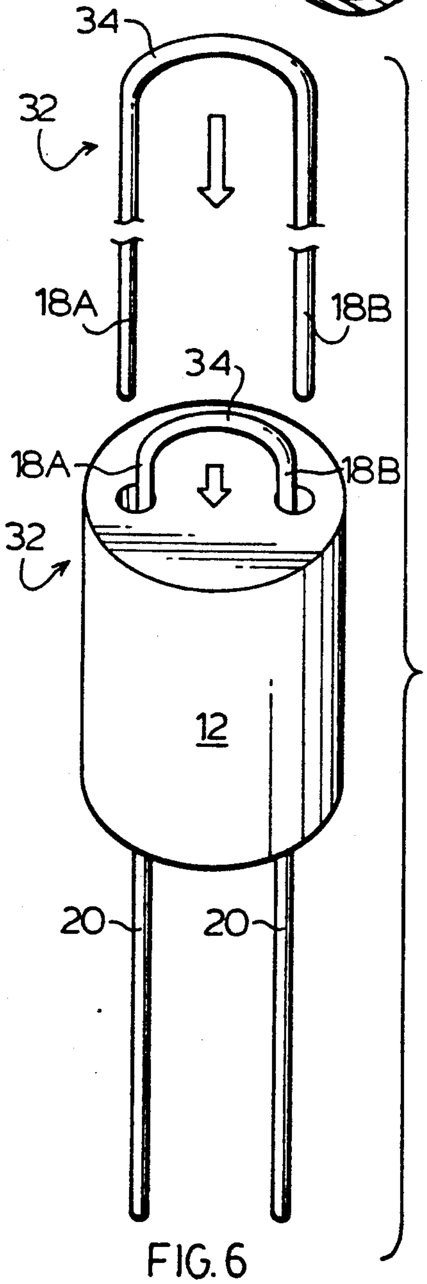
FIG. 6
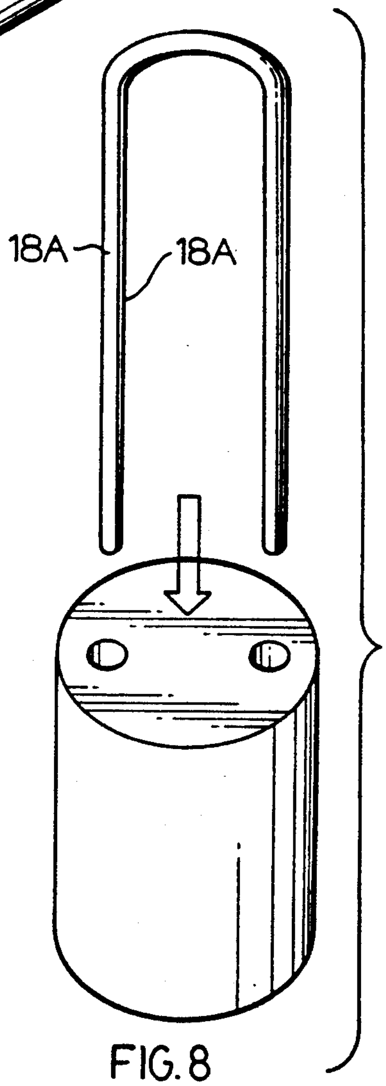
FIG. 8

TRANSMISSION LINE TRANSFORMER DEVICE

This invention relates to a transmission line transformer ('TLT') for use with signals in the range which may be larger than 5 to 1000 Megahertz (MHZ), as discussed in the following paragraphs and to devices such as hybrids, combiners or splitters which similarly to a transformer, process the wide band RF signals within such frequency range.

When a range of frequencies is given herein as 'about 5–1000 MHZ' the qualifier 'about' applies to both ends of the range.

The range over which the inventive TLT is useful depends on a number of factors. With a range of about 5–1000 MHZ it is well known in the art that the transmission line transformer acts more and more as a conventional transformer (and less and less as a TLT) for descending frequencies from 200 MHZ down to about 50 MHZ. Between about 50 and 5 MHZ therefore the TLT acts almost solely as a conventional transformer. Well known external tuning techniques are usually required for the range between about 5 and 25 MHZ. It must further be noted that selection of special (known) magnetically permeable materials, and known external tuning techniques may be used to widen the range to from about 3 MHZ to 2000 MHZ and it is entirely possible that future designs techniques will further enlarge the range. Moreover, the range stated is directly related to the performance desired. Thus, the figures set out above are in terms of an approximate insertion loss of less than 1 dB relative to the geometric centre of the range and a return loss of more than 16 dB absolute. For devices requiring only greater insertion loss and a smaller return loss, the range will be higher and for devices requiring smaller insertion loss and a greater return loss, the range will be smaller. Thus, the ranges stated herein, with which the invention may be used, are exemplary only and depend on design specifications and parameters.

By the term 'transmission line transformer device' or 'TLT device' I include transformers, splitters, combiners, and hybrids which effect such transformation of voltage, current, impedance or phase over the 5–1000 MHZ range or a selected bandwidth thereof and which use the phenomena of a transmission line transformer rather than those of a conventional transformer. The word hybrid has many meanings in various arts but hybrid is used herein to define a wide band transmission line transformation device having two or more input ports.

The purpose of combiners, hybrids and splitters will be known to those skilled in.. the art. Transmission line transformers and transformation devices have known uses for such purposes as:

(a) Isolation (b) Impedance transformation (c) Phase inversion (d) Balanced to unbalanced transformation 'Transmission line transformer' herein is sometimes abbreviated t 'TLT' and Transmission line transformation devices to TLT devices.

Transmission line transformers are discussed, inter alia, in the article "Transmission - Line Transformers" published in "IEEE Transactions on Microwave Theory and Techniques" by Ersch Rotholz Vol. MTT-29, No. 4, April 1981; in the article "The Transmission - Line Transformer" by Irving M. Gottlieb, published in the publication 'CQ' in the issue of July 1980; and in the article 'Transmission Line Transformer', published in the IEEE MTT-5 NEWSLETTER SUMMER/FALL 1989. The contents of these articles are included herein by reference. As these articles make clear, a transmission line transformer is a device well-defined in the art which operates without dependence upon the flux linkage of the conventional transformer. As the articles make clear, a transmission line transformer may be connected in different ways to provide a Wide variety of impedance, voltage or current transformations. It is also well known to connect a plurality of such transmission line transformers in various ways to form such circuits as splitters, combiners and hybrids. Because of the range of these latter uses as determined, inter alia, by circuit connections the invention is referred to as a transmission line transformer device rather than a transmission line transformer.

It is known that two or more transmission lines may be used to provide a TLT device when wound on a ferrite toroid or rod or formed as a coaxial line extending through a passage in a ferrite body. However the devices using a toroid or rod have been expensive to produce and difficult to manufacture with usually specified performance criteria. Those using a rod have in some cases poorer performance. Devices using a coaxial line have been found too expensive for many applications.

In the cable television ('CATV') industry which is a major field for the devices described herein, the wave band required has, in the past, extended from about 5-500 MHZ and presently may extend from 3-2000 MHZ and higher. For the latter bandwidth, transformation devices wound on toroids, and concentric lines have suffered from the disadvantages discussed in the previous paragraph. CATV suppliers have therefore tended to use miniaturized conventional transformers instead of TLT devices. However such miniaturized conventional transformers have been difficult to manufacture and sufficiently expensive to produce that only a limited number of suppliers are available.

This invention provides TLT devices wherein magnetically permeable material of the required permeability (usually ferrite) for the desired impedance characteristics of the devices across the bandwidth is used to define a pair of passages therethrough. The passages have adjacent first end openings and adjacent second end openings. The required number of insulated conductors are inserted in a first end opening and through one of the passages and the same number in the other first end opening. At the second end openings conductors of one passage are connected in one-to-one correspondence with conductors of the other passage. The character of the device e.g. transformer, splitter etc., and its ratio and polarity will be determined by the connections just outside the first end opening. The type and thickness of the insulation of the conductors and their spacing in the passageway as well as the conductor diameter will be chosen along with the impedance and dimensions of the sleeves in accord with a well known combining of known theoretical and known empirical techniques to provide the desired characteristic impedance for the conductor pairs or multiples over the required bandwidth which, (in the contemplation of the use of this invention) will be a material portion of the 5–1000 or larger MHZ range. The dimensions of the magnetically permeable material including the dimensions and spacing of the passages are selected again by a combination of well known theoretical and well known empirical techniques to provide the required impedance and other electro magnetic parameters to the conductors over the desired bandwidth and to (usually) place the passages as close together as possible while insolating the electro magnetic effects of one passageway from those of the other.

There is thus provided a transmission line transformation device suitable for making TLTs, splitters, combiners and hybrids within or across the 5–1000 MHZ range which are cheaper to produce than coaxial line devices, minaturized transformers of comparable performance; and of superior performance qualities to wound toroids or rods and cheaper and easier to produce and which reduce alignment or adjustment time of the transformer. The invention, with its side by side rather than concentric conductors achieves a much closer balanced effect in the conductors. The device is operable over at least three, decades of frequency range.

In devices in accord with the invention a magnetically permeable material may be in the form of two juxtaposed sleeves each containing a passage or a single sleeve may be provided having the two passages therethrough.

Preferably, with devices of the invention, the passages are made as small as will allow the insertion of the required number of conductors therethrough. This leads to the smallest diameter of passage, which is important factor in achieving desired electrical and magnetic qualities of the device but also leads to a cheaper product since the magnetically permeable material itself defining the passage then acts as the guide to maintain the conductor's location and in some variants of the invention, acts to maintain the conductor spacing and the proximity of the conductors also. Use of small passages brings the magnetic materials closer to the conductors and hence exposes the magnetic material to a stronger magnetic field which exists close to the conductor surface.

Alternatively to the criteria of the previous paragraph a passageway may be dimensioned for different numbers of conductors. Thus (for example) if a passage designed for three conductors is used for two, a piece of conductor or dielectric may be inserted as a dummy conductor to ensure the location and spacing of the two conductors with a performance sacrifice since the passage is of larger section than required for two conductors.

In one alternative of the invention the passageways are circular for ease of construction.

In another alternative the passageway section is determined by making the most compact shape given the section of a 'bundle' of insulated conductors and the section takes the shape of tangents to the outside surfaces of conductors ending at those conductor surfaces which are in effect outer corners of the bundle. Thus for two conductors the preferred shape is an oval, for three conductors an equilateral triangle with rounded corners and for four conductors a square with rounded corners the radius of the rounded corners being close to the radius of the conductor. Three or more conductors may be arranged to be aligned in section in an elongated slot.

While the foregoing paragraph implies that the conductors in a passage will all be of equal radius it should be noted that it is within the scope of the invention to use conductors of different radius.

Where there are two magnetically permeable members, each containing a passage, it is within the scope of the invention to provide members of different magnetic permeability.

It is within the scope of the invention to provide that the conductors in a passage are physically separate or, alternatively, that two or more of the conductors in a passage have been caused to adhere in side-by-side relationship (such as by fusing the insulation or other conventional technique).

The term 'side-by-side' in connection with two or more conductors in a passage include bifilar or multifilar conductors in twisted arrangement. It should be emphasized however that, although twisted multifilar conductors are within the scope of the invention they are not the preferred arrangement and will not provide the advantages of several preferred facets of the invention. The term 'generally parallel' refers to two or more conductors which are not twisted although otherwise side-by-side throughout their length. Conductors which are generally parallel may be individually separate or co-adherent and a slight change in radial spacing relationship along the conductor lengths is not physically significant and is considered within the 'generally parallel' definition.

In a preferred form of the invention the conductors are formed from lengths of insulated wire longer by two connection extents than the combined lengths of the two passageways and the distance between the second end openings Before insertion the length is bent to a hairpin to provide a conductor for each passage with the bend encompassing the distance between the two second end openings. The two conductors thus shaped are inserted in the two passages from the second end toward the first so that a very convenient method of constructing the device is provided The invention extends to the method of constructing the device as implied in the preceding paragraph.

When, in the construction of the device a plurality of conductors will be side-by-side in a 'bundle' and arranged to have their insulation co-adhering then, if all such conductors use the same pair of passages, such bundle is formed to the length described in the second preceding paragraph and then bent as a bundle into the hairpin shape for insertion in the two second end openings of such passages In general, the passageway will be made as small as will allow the conductors to be slid therethrough. The conductors are made as small as will allow them (or a bundle of them if co-adhering) to be pushed through the hole without buckling.

The passageways must be sufficiently spaced by magnetically permeable material so that electric or magnetic effects about one passageway do not affect the conductors or electric or magnetic parameters of the conductors in the other passageway. Subject to this, the passageways are preferably as close together as possible to make the conductors (and their second end connection) of as short overall length as possible and to make the sleeve or sleeves as small as possible.

In drawings which illustrate a preferred embodiment of the invention:

FIG. 1 is a perspective view (somewhat enlarged) of a transformer in accord with the invention, from one end, FIG. 2 is a section of a transformer in accord with the invention enlarged over the scale of FIG. 1, FIG. 3 is a partial section on a larger scale than FIG. 2 showing an alternate passageway section for a sleeve with two conductors per passageway, FIGS. 4 and 5 are partial sections on about the scale of FIG. 5 showing passageways of a section to receive three and four, respectively, conductors per passageway, FIG. 6 is a view showing the method of assembly a transmission line transformation device in accord with the invention, using physically separate individual conductors, FIG. 7 is a perspective view of a pair of co-adherent conductors for the transformer, FIG. 8 is a view showing the method of assembly of a transmission line transformation device in accord with the invention using co-adherent conductors, FIG. 9 shows schematically a device in accord with the invention connected as a transformer to effect a 4:1 impedance change, FIG. 10 shows schematically a pair of devices in accord with the invention connection as a splitter, FIGS. 11A, 11B, 11C indicate typical values in the frequency domain for the device of FIG. 10.

In FIG. 1 is shown a TLT device 10 in accord with the invention. The device comprises a cylindrical sleeve of magnetically permeable material 12 having a pair of insulated conductors 18 each comprising lengths 18A and 18B comprising wire with insulation 24 (shown in FIG. 2) extending generally parallel through passage 14 then between the second end openings 17 of passages 14 and 16 at the through passage 16 so that each conductor forms a narrow U or hairpin shape The selection of the electrical parameters for the device follows theoretical and empirical techniques well known to those skilled in the art. The passage diameter is selected to maintain the insulated conductors 18 in contact with each other The insulated conductors 18, the wire diameter and the insulation thickness and type and the sleeve 12 magnetic permeability and dimensions are selected to produce the desired characteristic impedance for the conductor pair and the desired overall impedance of the TLT.

The same well known techniques would be used if more than two conductors are placed in each circular passage. The magnetically permeable sleeve 12 preferably of ferrite, is selected with consideration of the other parameters to provide the required characteristic impedance for the device across the bandwidth—here of 5–1000 MHZ. The passageway diameter is chosen as small as will allow the required conductors to be pushed therethrough since the core-factor varies as an inverse function of the passage diameter. Use of small passages brings the magnetic materials closer to the conductors and hence exposes the magnetic materials to a stronger magnetic field which exists close to the conductor surface. The wire diameter is chosen as small as will allow the insulated conductors in the required number to be pushed through the passageway without buckling. The spacing of the passageways 14 and 16 will in most cases be selected to be as small as possible while maintaining the desired isolation between them. By the term 'isolation' I refer to the fact that there must be sufficient ferrite between the passages that the effects in the ferrite from conduction in the conductors of one passage do not materially affect the parameters associated with conduction of the conductors in the other passage. The outside diameter and the length of the sleeve are chosen to provide the required electric and magnetic qualities, including core-factor across the bandwidth. It is desireable, because the device is often used in restricted areas, to make the outer dimensions of the ferrite cylinder as small as possible as long as the other characteristics including core-factor are achieved. The dimensions of the sleeve 12 and the passage spacing are chosen having regard for the fact that the length of the side by side conductors from the entrance to passage 14 to the exit from passage 16 is limited to less than (about) ⅛ of the wavelength at the frequency end of the bandwidth. The length of the side-by-side conductors includes the span between the second end openings but will not usually include the connection extents 20 at the first end opening since the extents will not usually be side-by-side. (The wavelength must be calculated taking into account the velocity of propagation of the wave along the transmission line and the dielectric constant of, the ferrite material). Thus the core will be designed, taking other factors into account, to make the side-by-side conductors length of : twice the length of the core plus the spacing between the windings, plus two connection extents; as short as possible.

The core of FIG. 1 may be two cores axially aligned and with aligned pairs of passages with the two cores of different magnetic characteristics.

It is within the scope of the invention to make the conductors of twisted wire. However this is not preferred because twisted wires are not compatible with the preferred construction method. As is well known twisted wires affect the characteristic impedance and this must be taken into account in the design.

It is within the scope of the invention to use separate side by side ferrite sleeves, each with a single passageway, but a single sleeve with two passages is preferred.

With two conductors a better core-factor would be obtained and a better interaction between the conductors and the passageway walls is obtained if the passageways shaped as an oval. One of such passageways 26 is shown in FIG. 3. FIGS. 4 and 5 show passageways 28 and 30 shaped to receive 3 and 4 conductors. At present it is difficult to obtain ferrite core material with other than circular passageways. Thus it may be said that, at this time circular passages for two, three, or four conductors are preferred. However it is believed that cores with selectably shaped passages will, in future be available, at which time the embodiments of FIGS. 3, 4, and 5 will probably be preferred.

FIG. 6 shows the preferred method for constructing the transformation device in accord with the invention. As shown, the ferrite sleeve 12 is provided with each wire bent into a U shape or hairpin 32 to provide the two conducting lengths 18A and 18B, a preferably curved length 34 spanning the space between the passages and a length at the free ends for connection to other circuit elements. The conductors of a 'hairpin' 32 are simultaneously inserted in the passages. Then the other hairpin is inserted. If three or more conductors are required further conductors are inserted in the same manner. The device is then ready for connection to a circuit.

FIG. 7 shows that the conductors' lengths 18A and 18B, instead of being separate may be co-adherent in side by side generally parallel relationship. This may be accomplished by conventional techniques well known to those skilled in the art (most commonly by heat-fusing or bending the contiguous insulation layers 24 of co-tangent conductors). The same arrangement of conductors in adhering side by side arrangement may be achieved with three or four conductors.

FIG. 8 demonstrates that the method of construction by bending into a hairpin and inserting both ends in the two passages simultaneously may be achieved in one step with the device of FIG. 7 as with individual conductors.

FIG. 9 shows the use of the transmission device to convert the 75Ω characteristic line impedance to match a 18.75Ω line or device. The 75Ω line is connected to conductor 18A and from there to conductor 18B and then connected to node 38. As the schematic illustrates the circuit provides a 2:1 voltage conversion and a 1:4 impedance conversion.

(The impedance values indicated will only be approximated in practice). As shown in the drawing the grounded signal source 36 will be connected effectively in series with the 75Ω line impedance, along a conductor 18A, span 34A conductor 18B to the node 38. Node 38 is connected through a conductors 18A′, span 34B and a conductor 18B′ to ground. Node 38 is also connected to the 18.75Ω load impedance 40.

FIG. 10 shows schematically a pair of TLTs in accord with the invention connected to form a splitter with values as shown. As will be understood by those skilled in the art the circuit is only one of many that could be constructed with the TLT. The elements of FIG. 10 are numbered 100 plus the number of the corresponding element in FIG. 1. It will be appreciated that by well known techniques, the splitter may be designed to have 75Ω at port 1 (instead of the 150Ω shown) as well as at ports 2 and 3. It will also be appreciated that, a combiner source, 136 and its series resistance of FIG. 10 may be replaced by a load resistor 140 while each load resistor 140 of FIG. 10 will be replaced by a source 136 and a series resistance.

The circuit of FIG. 10 forms a two way splitter where the input power at port 1 is divided equally between ports 2 and port 3.

FIGS. 11A, 11B and 11C approximately indicate values for the circuit of FIG. 10. In these figures port 1, port 2 and port 3 are referred to as P1, P2 and P3 respectively. FIG. 11A shows insertion loss in dB between port 1 and port 2 or between port 1 and port 3, (in each case over the frequency range 5–1000 MHZ) these being the same in the circuit shown.

Figure 1:
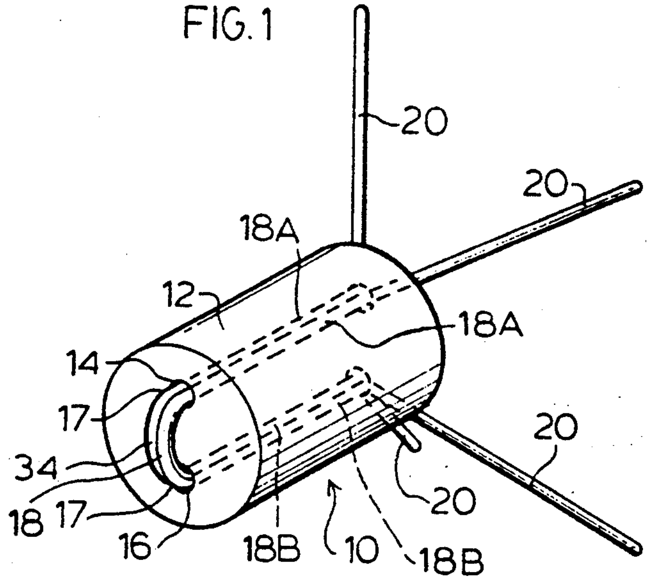
Figure 2:
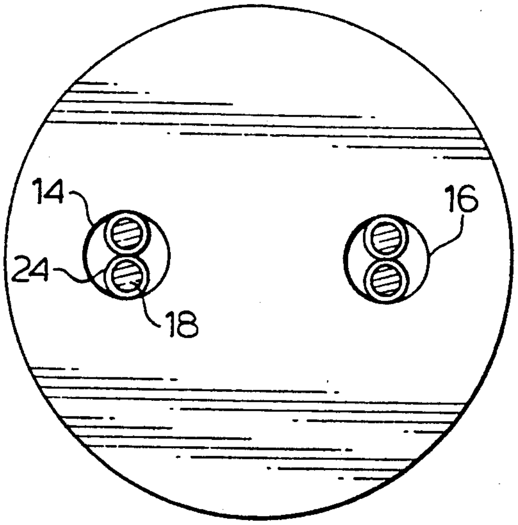
Figure 3:
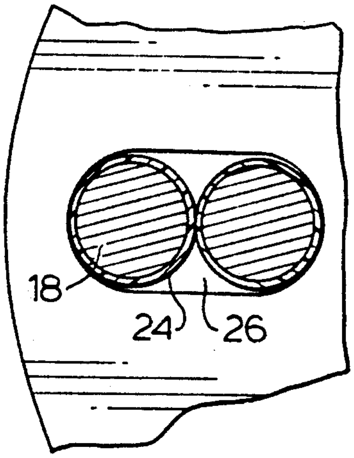
Figure 5:
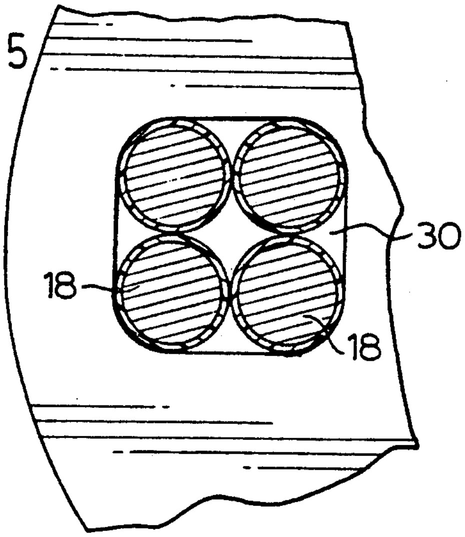
Figure 4:
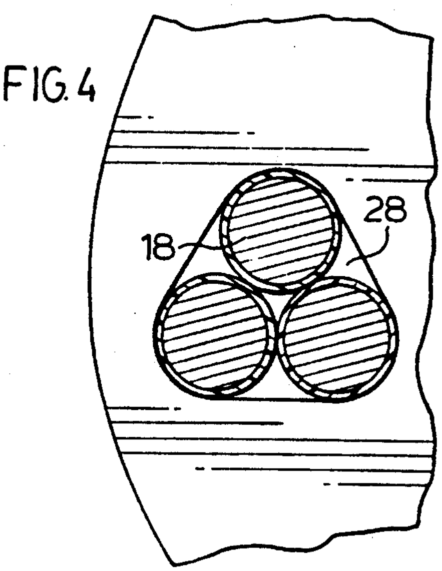
Figure 9:
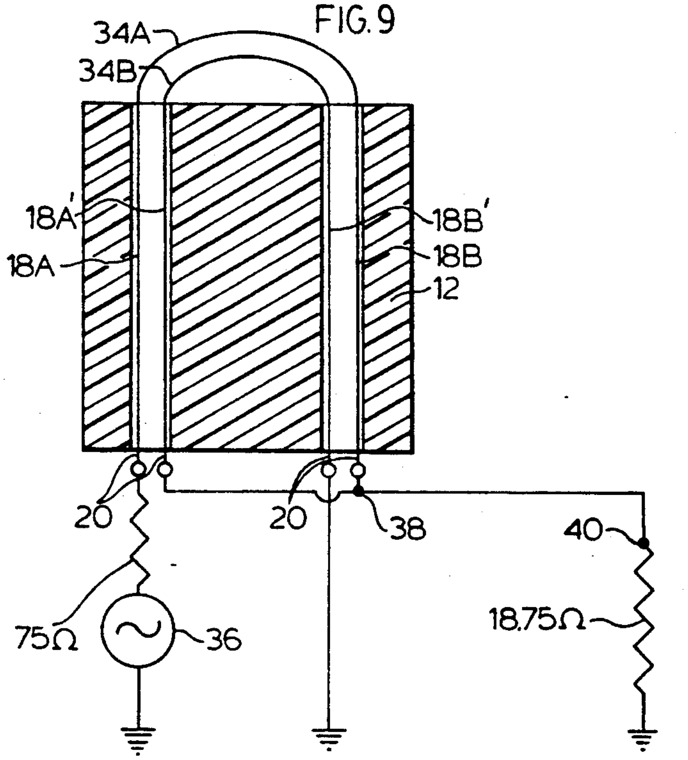
Figure 10:
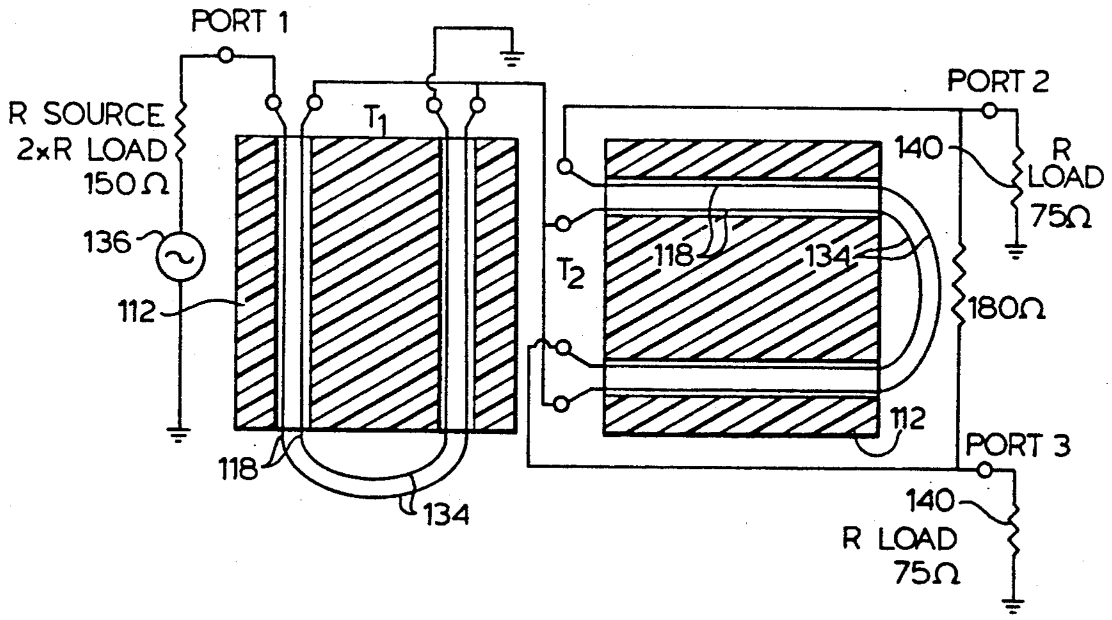
Figure 11A:
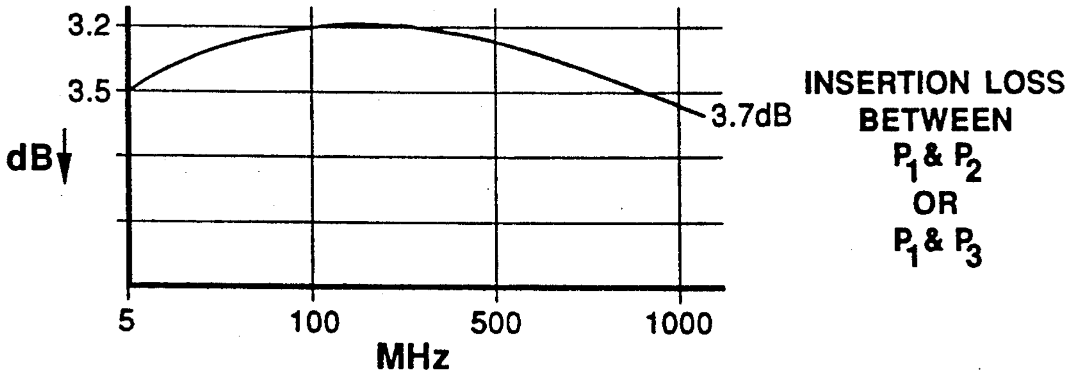
FIG. 11B shows return loss in dB of port P1, P2, and P3 over the 5–1000 MHZ range. It will be noted that the values for P2 and P3 are the same over the range and P1 coincides from relatively low frequencies upward.
FIG. 11C shows isolation between P2 and P3 over the frequency range.
Figure 11B:
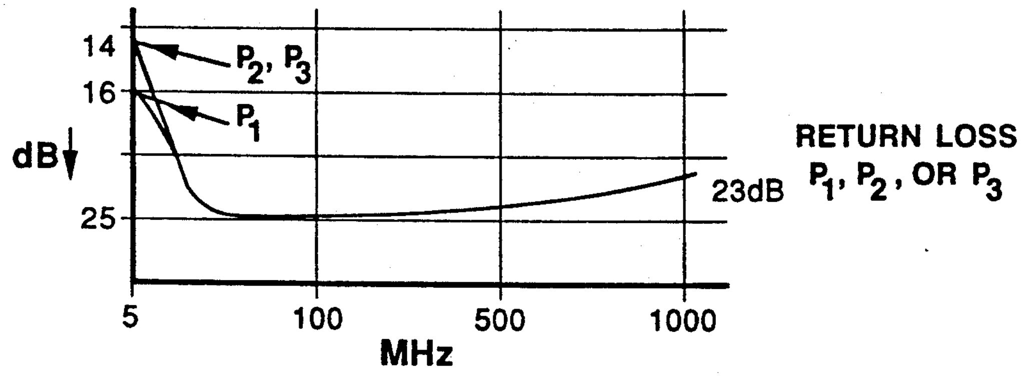
Figure 11C:
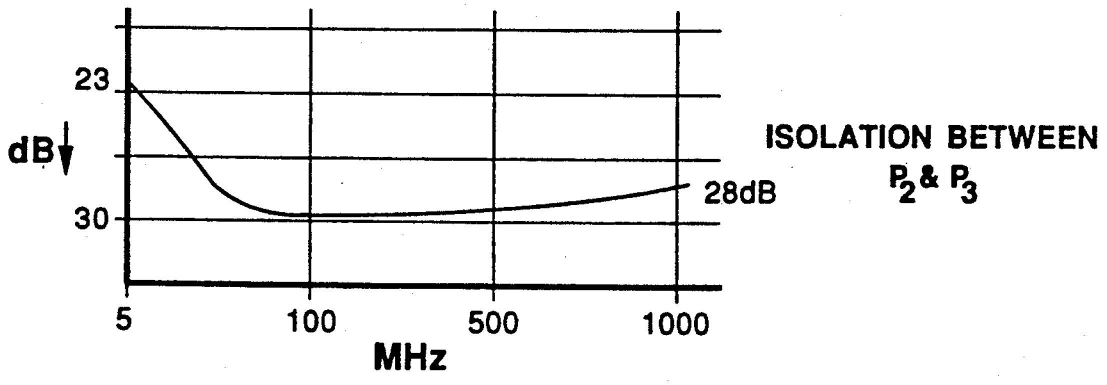

As stated in the introduction the frequency range may be expanded by exterior tuning means, selection of special materials and different selection of performance specifications.

Although the TLT devices described herein are 'passive' devices they may of course be combined with 'active' devices such as amplifiers or other active devices as desired.

I claim:

1. For use in a transmission line transformation device, for use in a selected bandwidth, comprising:

means providing a pair of passages surrounded by magnetically permeable material having respectively adjacent first and second end openings, a plurality of generally parallel insulated wire conductors arranged side-by-side extending from one of said first end openings through one of said passages, then between said second end openings and back through said other passage, each of the insulated wire conductors of said plurality terminating in free ends outside said first end openings, each said free end being adapted to be electrically and mechanically connected to another conductor, wherein said conductor insulation and spacing are adapted to provide predetermined characteristic impedance between respective pairs of the plurality of conductors across said bandwidth and said body dimensions and passage spacing are adapted to provide predetermined impedance across the bandwidth and isolation between conductors in one passage from those in the other.

2. Transmission line conductor as claimed in claim 1 wherein said passages are made as small as will allow the plurality of conductors to be slid therethrough.

3. Device as claimed in claim 2 wherein said conductors are co-adherent.

4. Transmission line transformer device as claimed in claim 2 wherein there are 2–of said conductors arranged in a side by side bundle, and where a section is defined by the outwardly facing curves of the conductors and the common tangential lines joining said curves and wherein said passages define a generally geometrically similar section.

5. Device as claimed in claim 1 wherein said conductors are co-adherent.

6. Transmission line transformer device as claimed in claim 1 wherein there are 2–4 of said conductors arranged in a side by side bundle, and where a section is defined by the outwardly facing curves of the conductors and the common tangential lines joining said curves and wherein said passages define a generally geometrically similar section.

7. Method of making a transmission line transformer device comprising the steps of providing magnetically permeable material defining a pair of passages therethrough adapted to receive a predetermined plurality of conductors, said passage defining a pair of first end openings and a pair of second end openings, providing lengths of insulated wire each adapted to form a conductor in each passage, a connection between them, and a connection extent for each end, forming said lengths into a pair of conductors, and connection extents one for each passage, connected by a 180° bend adapted to span the distance between said second end openings, contemporaneously inserting the conductors into each passage at said second end openings, and pushing said conductors through said passages so that said connection extents protrude therefrom.

8. Method as claimed in claim 7 wherein each conductor in a passage is physically separate from the other conductors in the same passage and said hairpin bent lengths are sequentially inserted into said passages until all said conductors are inserted.

9. Method as claimed in claim 7 wherein a plurality of said lengths are formed in a co-adherent bundle before bending into said hairpin for insertion.

10. Method as claimed in claim 7 wherein said passages are dimensioned for a number of conductors greater than the number to be received in each passage and non conducting blanks having the dimensions of a conductor are inserted in each passage so that in each passage the dimensions of the blanks plus the dimensions of the lengths make a close fit with the walls of the passage.

11. For use in a transmission line transformation device, for use in a selected bandwidth, comprising:

means providing a pair of passages surrounded by magnetically permeable material having respectively adjacent first and second end openings, a plurality of generally parallel insulated wire conductors arranged side-by-side extending from one of said first end openings through one of said passages, then between said second end openings and back through said other passage, wherein said conductor insulation and spacing are adapted to provide predetermined characteristic impedance between respective pairs of the plurality of conductors across said bandwidth and said body dimensions and passage spacing are adapted to provide predetermined impedance across the bandwidth and isolation between conductors in one passage from those in the other, wherein there are 2–4 of conductors arranged in a side by side bundle, and where a section is defined by the outwardly facing curves of the conductors and the common tangential lines joining said curves and wherein said passages define a generally geometrically similar section.

* * * * *